United States Patent
Tan et al.

(10) Patent No.: US 8,987,072 B2
(45) Date of Patent: Mar. 24, 2015

(54) METHOD OF MANUFACTURING AN LTPS ARRAY SUBSTRATE

(71) Applicant: EverDisplay Optronics (Shanghai) Limited, Shanghai (CN)

(72) Inventors: Li Tan, Shanghai (CN); ChihMing Lin, Shanghai (CN); HsinAn Lin, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/260,101

(22) Filed: Apr. 23, 2014

(65) Prior Publication Data

US 2014/0315357 A1    Oct. 23, 2014

(30) Foreign Application Priority Data

Apr. 23, 2013    (CN) .......................... 2013 1 0143575

(51) Int. Cl.
*H01L 21/12* (2006.01)
*H01L 27/12* (2006.01)
*H01L 29/66* (2006.01)

(52) U.S. Cl.
CPC .......... *H01L 27/127* (2013.01); *H01L 27/1203* (2013.01); *H01L 27/1214* (2013.01); *H01L 29/66795* (2013.01)

USPC ........................................................ 438/154

(58) Field of Classification Search
USPC ...................................................... 257/E21.4
See application file for complete search history.

(56) References Cited

U.S. PATENT DOCUMENTS

2009/0104737 A1    4/2009    Sato et al.
2009/0134400 A1    5/2009    Cheng

FOREIGN PATENT DOCUMENTS

CN            102651337 A         8/2012

*Primary Examiner* — Cheung Lee
(74) *Attorney, Agent, or Firm* — Tim Tingkang Xia, Esq.; Morris, Manning & Martin, LLP (57) ABSTRACT

The present disclosure discloses a method of manufacturing the LTPS array substrate, comprising: depositing a polysilicon layer and an amorphous silicon layer on the substrate successively and crystallizing the amorphous silicon layer to form the polysilicon layer by laser annealing; coating a photoresist layer covering the PMOS area, NMOS area and TFT area of the polysilicon layer; forming a polysilicon pattern and a channel by dry etching the polysilicon layer, then removing the regions of the photoresist layer which are thinner and covering the NMOS area and the TFT area by ashing, the region of the photoresist layer covering the PMOS area is remained. The present disclosure saves the cost of the equipment, improves the yield, reduces the design defect and the process difficulty of the conventional process using 8 photomasks.

13 Claims, 6 Drawing Sheets

METHOD OF MANUFACTURING AN LTPS ARRAY SUBSTRATE

CROSS-REFERENCE TO RELATED APPLICATIONS

The present application claims priority to and the benefit of Chinese Patent Application No. CN 201310143575.4, filed on Apr. 23, 2013, the entire content of which is incorporated herein by reference.

BACKGROUND OF THE INVENTION

1. Field of the Invention

The present disclosure relates to a thin-film transistor ("TFT", hereinafter) array substrate, more specifically to a method of manufacturing an LTPS array substrate.

2. Description of the Related Art

Liquid Crystal Display (LCD) or Active Matrix/Organic Light Emitting Diode (AMOLED) displays images by the light transmittance of liquid crystal (LC) controlled by electric field, or by the lightness of the organic luminescent materials controlled by electric current. To these displays, it is necessary to utilize TFT array substrate to drive and control the pixels by voltage or current. The TFT array substrate comprises scanning lines, signal lines and TFT. In order to achieve the requirement of high resolution, the current TFT array substrate is mostly manufactured by the low-temperature polysilicon (LTPS) manufacturing process. As the TFT array substrate, especially the LTPS substrate is manufactured by the semiconductor process and a plurality of photomask processes, which are very complex. Consequently, the cost is relatively high.

A relatively whole photomask process includes a plurality of processes, such as the cleaning process, the thin-film deposition process, the photoetch process, the etching processes, the photoresist stripping and the examining process. Moreover, some processes using the photomask further comprise the process of laser annealing and ions implantation. Presently, the mass-produced LTPS array substrates are usually made by the CMOS process including 9 or 8 photomasks.

Figure 1:
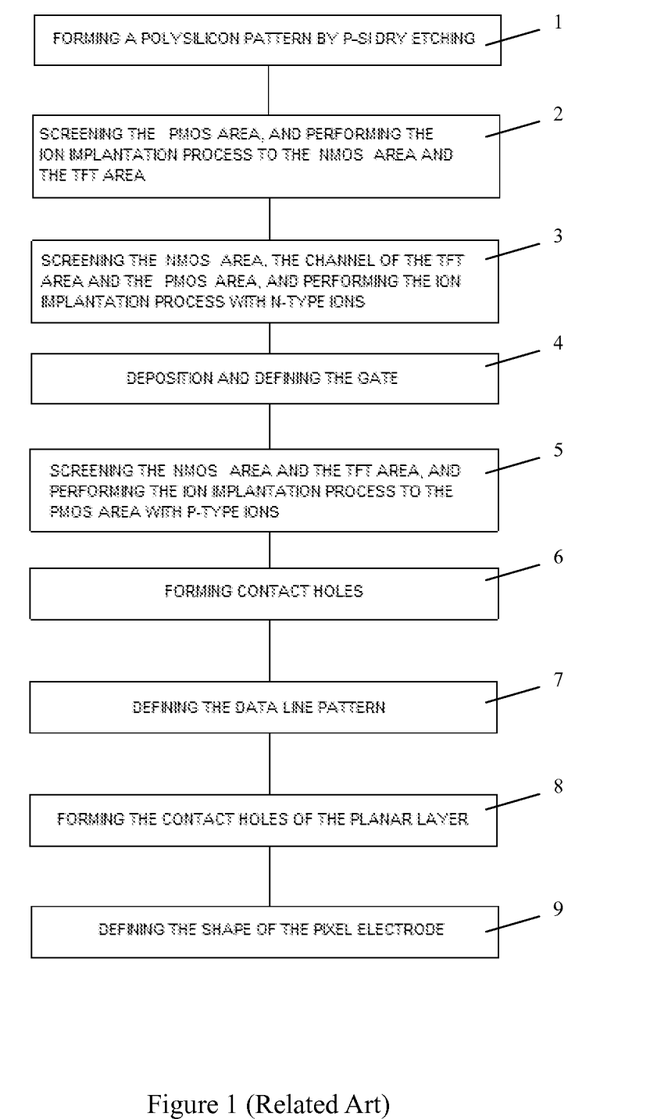
FIG. 1 shows a simplified diagram of the CMOS process including 9 photomasks in the related art.
Figure 2A:
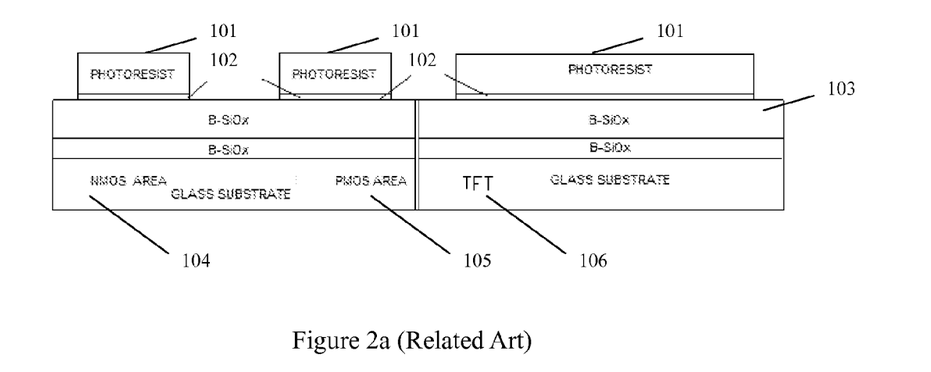
FIG. 2a shows the sectional view of the polysilicon pattern formed in the first process applying the first photomask of the CMOS process including 9 photomasks in the related art.
Figure 2B:
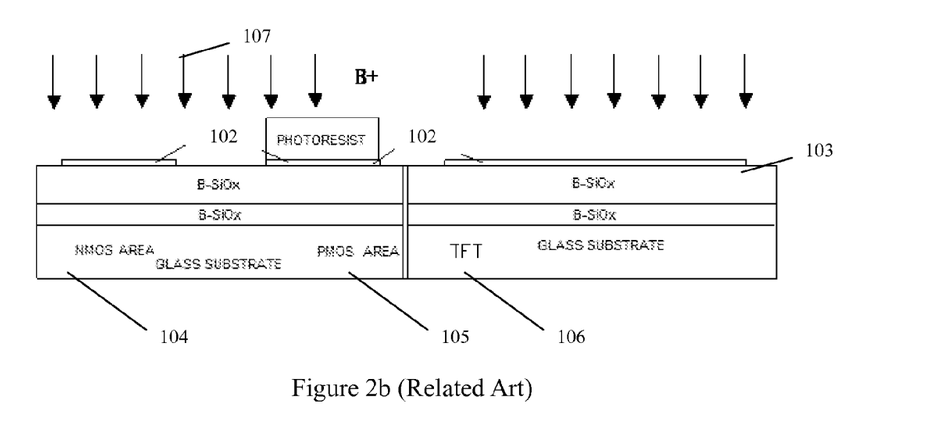
FIG. 2b shows the sectional view of the channel doping formed in the second process applying the second photomask of the CMOS process including 9 photomasks in the related art.

FIG. 1 shows a simplified diagram of the CMOS process including 9 photomasks, successively including: 1: P—Si Pattern Process, by which a polysilicon is formed after dry etching, and FIG. 2a shows a diagram of using the photomask in this step; 2: Channel Doping Process, by which the photomask used is shown by the sectional view in FIG. 2b; 3: N+Doping (S/D) Process, by which the P-type area is screened and the N-type area is implanted with ions (source/drain); 4: Gate Electrode Deposition (M1) Process, by which a first metal layer is formed and the gate is defined; 5: P+Doping Process, by which the N-type area is screened and the P-type area is implanted with ions; 6: Contact Hole Process, by which contact holes are formed; 7: Wiring Layer (M2) Process, by which the wiring layer is formed after forming a second metal layer and defining the pattern of date lines; 8: PLN (Planarization) Process, by which a planar layer is deposited and contact holes are formed; 9: Pixel Electrode Process, by which the shape of pixel electrode is defined.

Figure 3:
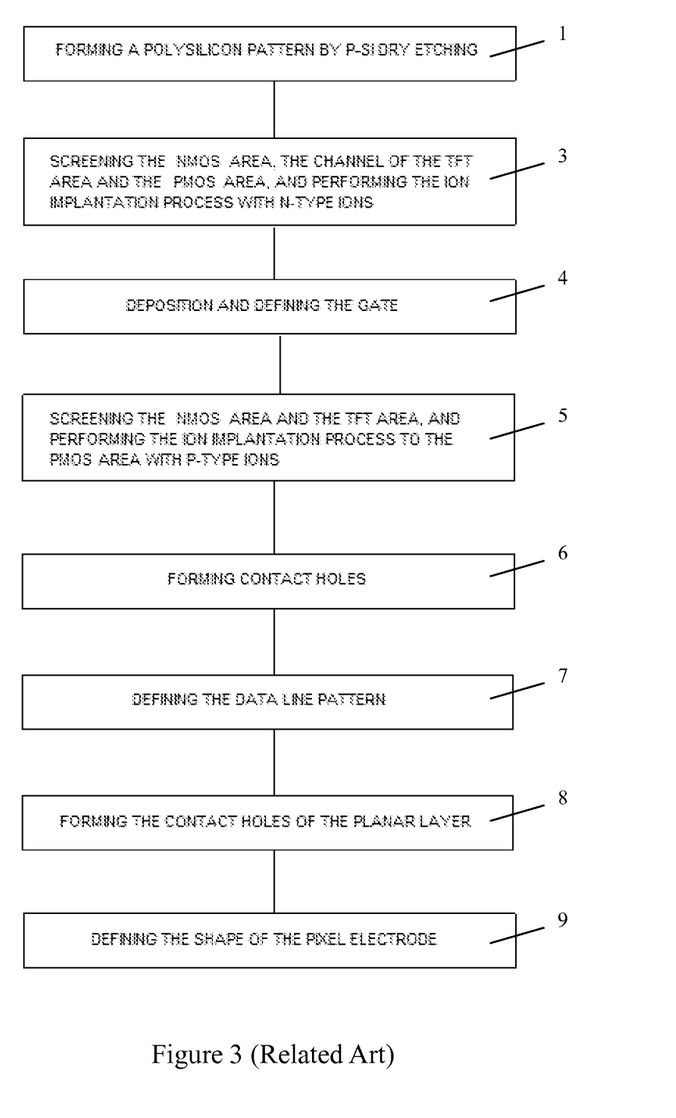
FIG. 3 shows a simplified diagram of the CMOS process including 8 photomasks in the related art.

FIG. 3 shows a simplified diagram of the CMOS process including 8 photomasks. Actually, the essence thereof is to cancel the second step in the process including 9 photomasks shown in FIG. 1, i.e., the Channel Doping Process is not performed. However, there are defects in the CMOS process including 8 photomasks in the flowing three aspects.

Figure 4A:
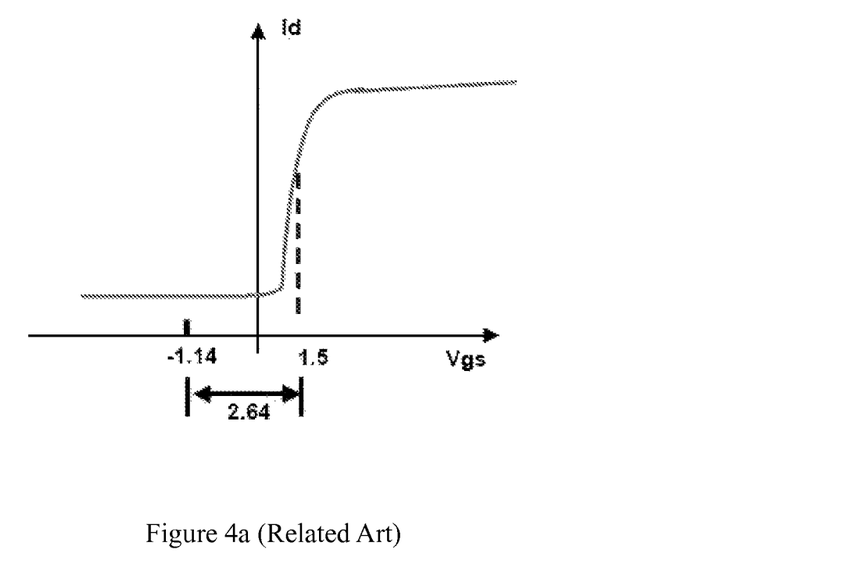
FIG. 4a shows a curves diagram of the relation between Id and Vgs of the CMOS process including 9 photomasks in the related art.
Figure 4B:
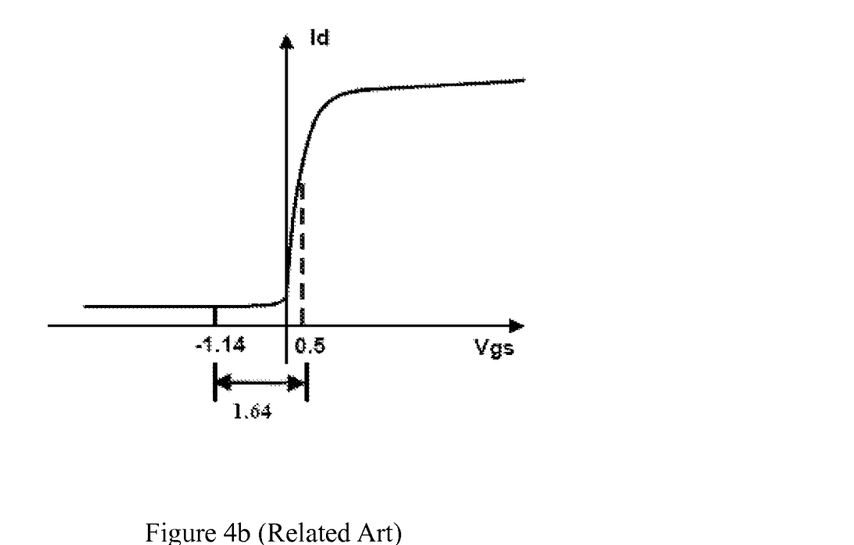
FIG. 4b shows a curves diagram of the relation between Id and Vgs of the CMOS process including 8 photomasks in the related art.

The redundancy of the design is smaller. The redundancy becomes smaller from 2.64V to 1.64V as FIGS. 4a and 4b show, wherein, Vcom ranges form 0.64V to 4.44V, whose voltage difference is 3.8V; data-signal ranges form 0.94V to 4.14V, when the coupling occurs, the data signal is changed by the following formula: 0.94−3.8=−2.86V; VgateH: 8.5−4.14=4.36V (VGS@gate ON); VgateL: −4−(−2.86)=−1.14V (VGS@gate OFF).

The power loss is higher. As Channel Doping Process is canceled, the migration rate will be reduced. In order to acquire the same output current, it is necessary to increase the driving voltage of the panel, which causes a higher power consumption of the panel.

The requirement of the uniformity for Vthn and Vthp is higher. As the migration rate is reduced, it is necessary to reduce the channel length of the devices to increase W/L in design, which needs short channel devices of excellent uniformity. Hence, a p-Si film with better uniformity is necessary to be used, which increases the difficulty of the process and design.

A related art has disclosed a method for manufacturing a TFT substrate in which a channel length can be stably formed while the number of masks is reduced, and a method for manufacturing a TFT substrate which can individually control impurity concentrations for channels of an n-type TFT and a p-type TFT without increasing the number of masks. A method for manufacturing a TFT substrate includes processing a gate of the n-type TFT, a gate of the p-type TFT, and an upper capacitor electrode by using a half-tone mask instead of some of normal masks to reduce the number of masks, and changing impurity concentrations of semiconductor films located in regions which become a channel of the n-type TFT, a source and a drain of the n-type TFT, a channel of the p-type TFT, a source and a drain of the p-type TFT, and an lower capacitor electrode, by using a pattern of the half-tone mask and a normal mask.

Another related art has disclosed an LTPS-LCD structure and a method for manufacturing the structure are provided. The structure comprises a substrate where a plurality of pixels are formed thereon. Each of these pixels comprises a control area, a capacitance area, and a display area. The structure is initially formed with a transparent electrode on the substrate, followed by a control device, a capacitance storage device. The display unit is then formed on the control area, the capacitance area, and the display area, respectively. As a result, the capacitance of the structure can be enhanced and the manufacturing processes of masks can be reduced. Consequently, it did not solve the problem that the cost of manufacturing the TFT array substrate is relatively high.

SUMMARY OF THE INVENTION

An embodiment of the present disclosure is directed toward a method of manufacturing an LTPS array substrate capable of saving the cost of the equipment, improving the yield, reducing the design defect and the process difficulty of the conventional process using 8 photomasks.

A method of manufacturing an LTPS array substrate, comprising:

(a) providing an LTPS pre-structure with a polysilicon layer surface; wherein an NMOS area, a PMOS area and a TFT area are predefined in the LTPS pre-structure;

(b) forming a photoresist layer covering the PMOS area, the NMOS area and the TFT area; wherein a region of the photoresist layer covering the PMOS area is thicker than those covering the NMOS and TFT area;

(c) exposing the surface of the NMOS area and TFT area in the LTPS pre-structure; and (d) implanting ions into the NMOS area and TFT area.

According to one embodiment of the present disclosure, further comprising the steps of:

screening the P-type channel of the NMOS area, the P-type channel of the PMOS area and the P-type TFT area and performing the ion implantation process to form an N-type source area, an N-type drain area and an N-type TFT area;

depositing a gate electrode, forming a first metal layer, and defining the gates;

screening the N-type channel of the NMOS area and the N-type TFT area and performing the ion implantation process to form the P-type source area, the N-type drain area;

forming contact holes on the source, drain, gate of the NMOS area, PMOS area and TFT area respectively;

depositing a wiring layer, forming a second metal layer, and defining the patterns of the data lines in the wiring layer;

depositing a planar layer and forming contact holes of the planar layer at the TFT area; and coating an ITO film, and defining the patterns of the pixel electrodes in the ITO film.

According to one embodiment of the present disclosure, wherein Step (c) further comprises:

forming a polysilicon isolation structure before exposing the surface of the NMOS area and TFT area in the LTPS pre-structure.

According to one embodiment of the present disclosure, wherein the surface of the NMOS area and TFT area in the LTPS pre-structure is exposed by removing the photoresist layer within a predefined thickness.

According to one embodiment of the present disclosure, the region of the photoresist layer covering the PMOS area is at least twice as thick as the regions of the photoresist layer covering the NMOS area and TFT area.

According to one embodiment of the present disclosure, the region of the photoresist layer covering the PMOS area is twice or three times as thick as the regions of the photoresist layer covering the NMOS area and TFT area.

According to one embodiment of the present disclosure, wherein, in Step (b), the photoresist layer is formed by GTM process.

According to one embodiment of the present disclosure, wherein, in Step (b), the photoresist layer is formed by HTM process.

According to one embodiment of the present disclosure, wherein, the material of the planar layer is PC403 or PC452.

According to one embodiment of the present disclosure, wherein, the wiring layer is made of the metal of molybdenum and aluminum.

According to one embodiment of the present disclosure, wherein, the LTPS pre-structure further comprises:

providing an LTPS array substrate where the NMOS area, the PMOS area and the TFT area is predefined;

forming a polysilicon layer and an amorphous silicon layer above the LTPS pre-structure in sequence;

performing a crystallizing process which transforms the amorphous silicon layer to the polysilicon layer by laser annealing.

According to one embodiment of the present disclosure, the polysilicon layer comprises a SiNx layer and a SiOx layer; and the SiOx layer covers the SiNx layer.

According to one embodiment of the present disclosure, wherein, in step (a), the photoresist is removed by ashing process.

According to one embodiment of the present disclosure, wherein, the polysilicon isolation structure is formed by dry etching.

BRIEF DESCRIPTIONS OF THE DRAWINGS

The accompanying drawings, together with the specification, illustrate exemplary embodiments of the present disclosure, and, together with the description, serve to explain the principles of the present disclosure.

DETAILED DESCRIPTION

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

The present disclosure replaces the former two photomasks in the process which applies 9 photomasks with a photomask by means of HTM (Half Tone Mask) or GTM (Gray Tone Mask), and the process of channel doping is remained.

In the method of the present disclosure, the LTPS array substrate includes an NMOS area, a PMOS area 105 and a TFT area.

Firstly, depositing a polysilicon layer 103 and an amorphous silicon (a-Si) layer on a glass substrate successively. The polysilicon layer 103 includes a SiNx layer and a SiOx layer, and the SiOx layer covers the SiNx layer. Next, crystallizing the amorphous silicon layer to transform the amorphous silicon layer into the polysilicon (p-Si) layer by laser annealing, and then an LTPS pre-structure is formed.

Embodiment 1

Figure 5A:
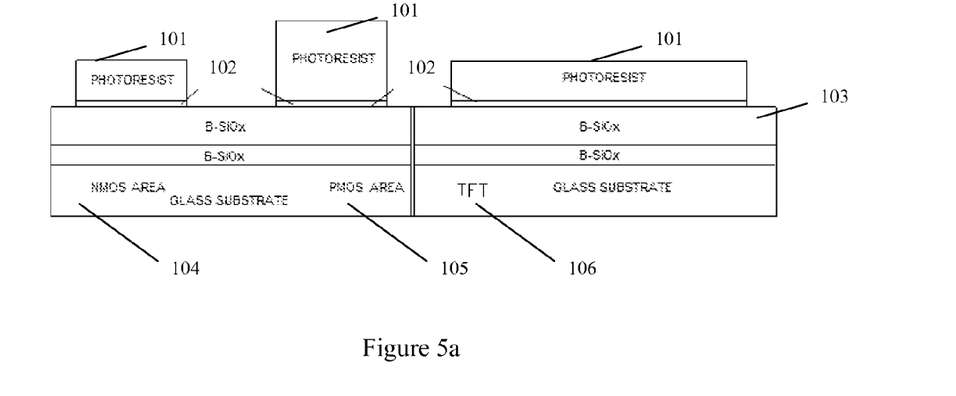
FIG. 5a shows the sectional view of the polysilicon pattern formed by the photomask applied in the first process of Embodiment 1 of the present disclosure.
Figure 5B:
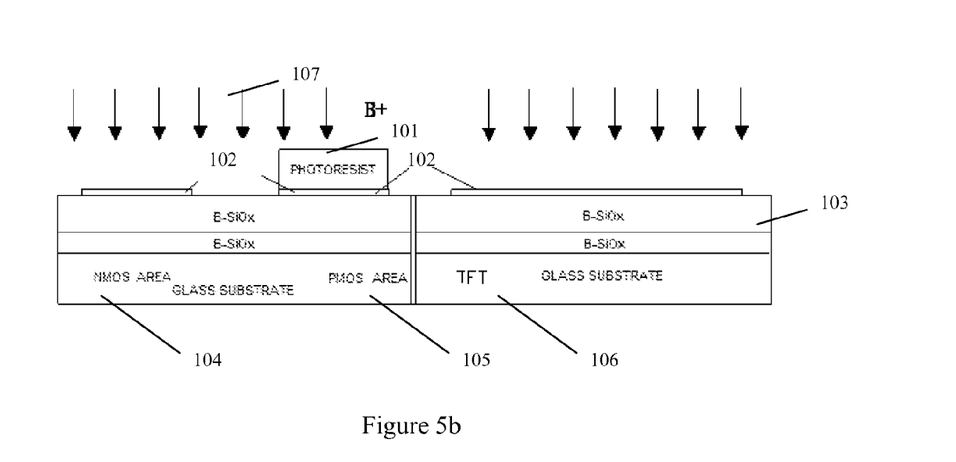
FIG. 5b shows the sectional view of the channel doping performed by the photomask applied in the second process of Embodiment 1 of the present disclosure.

As shown in FIGS. 5a and 5b, in the first embodiment of the present disclosure, a photoresist layer 101 is formed and covering the PMOS area, NMOS area 104 and TFT area 106 of the polysilicon layer 102. The region of the photoresist layer 101 covering the PMOS area 105 is larger than the regions of the photoresist layer 101 covering the NMOS area 104 and the TFT area, preferably, in this embodiment the region of the photoresist layer 101 covering the PMOS area 105 is at least twice as thick as the regions of the photoresist layer 101 covering the NMOS area 104 and the TFT area. The TFT area 106 and other areas are not covered with the photoresist layer 101. The polysilicon isolation structure is formed preferably by dry etching the polysilicon layer 102. Next, exposing the surface of the NMOS area and TFT area in the LTPS pre-structure. Preferably, the surface of the NMOS area and TFT area in the LTPS pre-structure is exposed by removing the photoresist layer within a predefined thickness, as a result, the regions of the photoresist layer 101 which are thinner and covering the NMOS area 104 and the TFT area 106 is removed, by ashing, and the region of the photoresist covering the PMOS area 105 is remained.

Preferably, the difference in thickness of the regions of the photoresist layer 101 covering the PMOS area, the NMOS area 104 and the TFT area 106 is caused by GTM (Gray Tone Mask) or HTM (Half Tone Mask).

Next, the PMOS area 105 is screened, and the ion implantation 107 is performed to the NMOS area 104 and the TFT area. Preferably, the ion implantation 107 is boron implantation.

Next, an N-type source, an N-type drain area and an N-type TFT area 106 are formed by screening the N-type channel of NMOS area 104 and the N-type TFT area 106 and by performing the ion implantation 107 process.

The gate electrode is deposited, a first metal layer is formed, and the gate is defined.

The N-type channel of NMOS area 104 and N-type TFT area 106 are screened and the ion implantation 107 process is performed to form a P-type source area and a P-type drain area.

The contact holes are respectively formed on the source, drain, gate of the TFT area, the NMOS area 104 and the PMOS area.

The wiring layer is deposited, a second metal layer is formed, a planar layer is deposited, an ITO film is coated, and the patterns of the pixel electrodes are defined in the ITO film.

Preferably, the material of the planar layer is the PC403 or PC452 produced by JSR Company, and the wiring layer is the metal laminate of molybdenum and aluminum (Mo—Al—Mo).

Embodiment 2

Figure 6A:
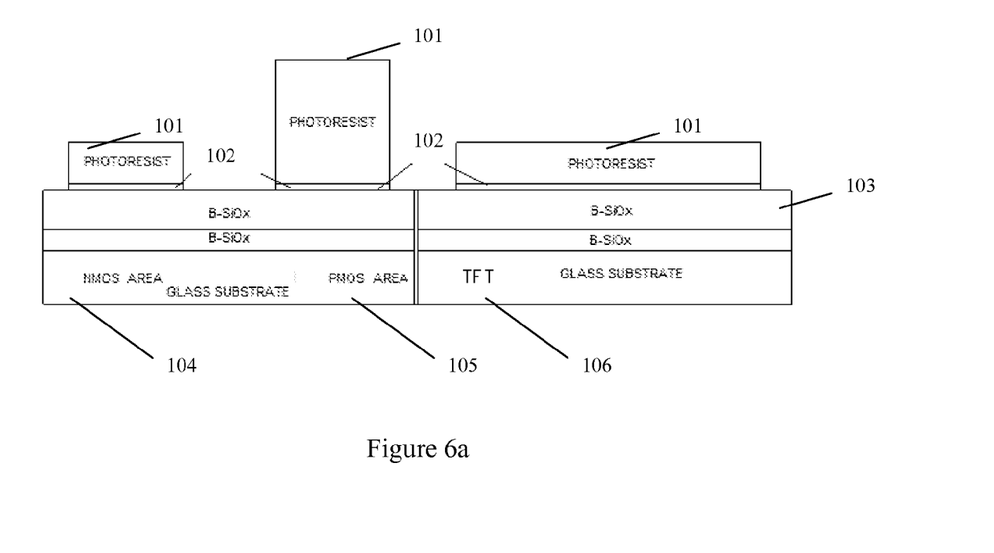
FIG. 6a shows the sectional view of the polysilicon pattern formed by the same photomask applied in the first process of Embodiment 2 of the present disclosure.
Figure 6B:
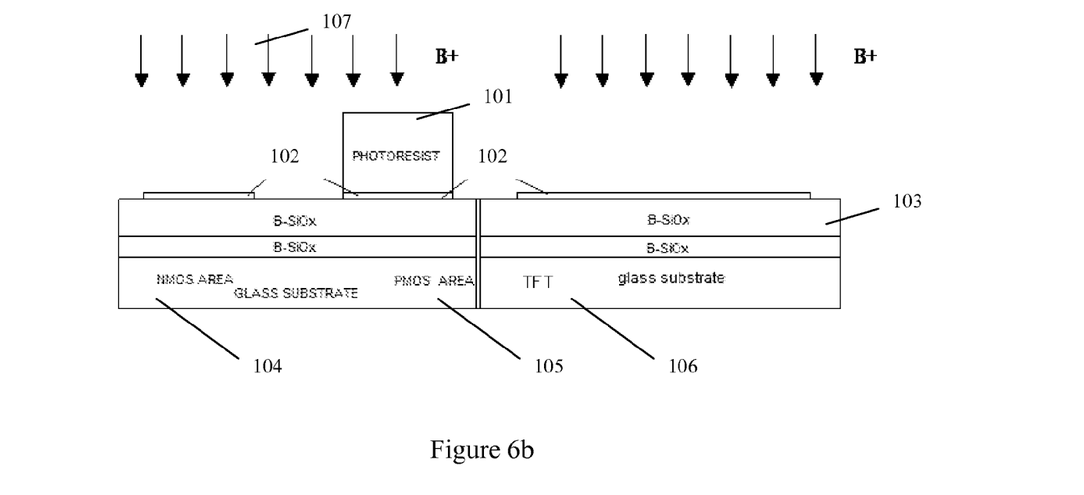
FIG. 6b shows the sectional view of the channel doping performed by the same photomask applied in the second process of Embodiment 2 of the present disclosure.

As shown in FIG. 6a, in the second embodiment of the present disclosure, a photoresist layer 101 is formed and covering on the PMOS area, NMOS area 104 and TFT area 106 of the polysilicon layer 102. The region of the photoresist layer 101 covering the PMOS area 105 is larger than the regions of the photoresist layer 101 covering the NMOS area 104 and the TFT area, preferably, in this embodiment the region of the photoresist layer 101 covering the PMOS area 105 is twice or three times as thick as the regions of the photoresist layer 101 covering the NMOS area 104 and the TFT area. The TFT area 106 and other areas are not covered with photoresist layer 101. The polysilicon isolation structure is formed preferably by dry etching the polysilicon layer 102. Next, exposing the surface of the NMOS area and TFT area in the LTPS pre-structure. Preferably, the surface of the NMOS area and TFT area in the LTPS pre-structure is exposed by removing the photoresist layer within a predefined thickness, as a result, the regions of the photoresist layer 101 which are thinner and covering the NMOS area 104 and the TFT area 106 are removed, by ashing, as shown in FIG. 6b. The region of the photoresist layer 101 covering the PMOS area 105 is remained.

Preferably, the difference in thickness of the regions of the photoresist layer 101 covering the PMOS area, the NMOS area 104 and the TFT area 106 is caused by GTM (Gray Tone Mask) or HTM (Half Tone Mask).

Next, the PMOS area 105 is screened, and the ion implantation 107 process is performed to the NMOS area 104 and the TFT area. Preferably, the ion implantation 107 is boron implantation.

Next, an N-type source/drain area and an N-type TFT area 106 are formed by screening the N-type channel of the NMOS area 104 and the N-type TFT area 106 and by performing the ion implantation 107 process.

The gate electrode is deposited, a first metal layer is formed, and the gate is defined.

The N-type channel of the NMOS area 104 and N-type TFT area 106 are screened and the ion implantation 107 process is performed to form the P-type source area and the P-type drain area.

The contact holes are respectively formed on the source, drain, gate of the TFT area, the NMOS area 104 and the PMOS area.

The wiring layer is deposited, the second metal layer is formed, and the patterns of the data lines are defined in the wiring layer.

The planar layer is deposited, the contact holes of the planar layer are formed at the TFT area, an ITO film is coated, and the patterns of the pixel electrodes are defined in the ITO film.

Preferably, the material of the planar layer is the PC403 or PC452 produced by JSR Company, and the wiring layer is the metal laminate of molybdenum and aluminum (Mo—Al—Mo).

The above mentioned contents are the main processes of the method using 8 photomasks to manufacture the LTPS array substrate in the present disclosure. By utilizing the method, the cost of the equipment is reduced, the yield is improved, and the design defect and the process difficulty of the conventional process using 8 photomasks are reduced.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an LTPS array substrate, comprising:
    (a) providing an LTPS pre-structure with a polysilicon layer surface; wherein an NMOS area, a PMOS area and a TFT area are predefined in the LTPS pre-structure;
    (b) forming a photoresist layer covering the PMOS area, the NMOS area and the TFT area; wherein a region of the photoresist layer covering the PMOS area is thicker than those covering the NMOS and TFT areas;
    (c) exposing the surface of the NMOS area and TFT area in the LTPS pre-structure; and
    (d) implanting ions into the NMOS area and TFT area.

2. The method as claimed in claim 1 further comprising the steps of:
    screening a P-type channel of the NMOS area, a P-type channel of the PMOS area and a P-type TFT area and performing an ion implantation process to form an N-type source area, an N-type drain area and an N-type TFT area;
    depositing a gate electrode, forming a first metal layer, and defining gates;
    screening an N-type channel of the NMOS area and an N-type TFT area and performing an ion implantation process to form a P-type source area, an N-type drain area;
    forming contact holes on the source, drain, gate of the NMOS area, PMOS area and TFT area respectively;
    depositing a wiring layer, forming a second metal layer, and defining patterns of data lines in the wiring layer;
    depositing a planar layer and forming contact holes of the planar layer at the TFT area; and
    coating an ITO film, and defining patterns of pixel electrodes in the ITO film.

3. The method as claimed in claim 2, wherein Step (c) further comprises:
    forming a polysilicon isolation structure before exposing the surface of the NMOS area and TFT area in the LTPS pre-structure.

4. The method as claimed in claim 2, wherein, the wiring layer is made of a metal of molybdenum and aluminum.

5. The method as claimed in claim 3, wherein the surface of the NMOS area and TFT area in the LTPS pre-structure is exposed by removing the photoresist layer within a pre-defined thickness.

6. The method as claimed in claim 3, wherein, the polysilicon isolation structure is formed by dry etching.

7. The method as claimed in claim 1, wherein, the region of the photoresist layer covering the PMOS area is at least twice as thick as the regions of the photoresist layer covering the NMOS area and TFT area.

8. The method as claimed in claim 7, wherein, the region of the photoresist layer covering the PMOS area is twice or three times as thick as the regions of the photoresist layer covering the NMOS area and TFT area.

9. The method as claimed in claim 8, wherein, in Step (b), the photoresist layer is formed by GTM process.

10. The method as claimed in claim 8, wherein, in Step (b), the photoresist layer is formed by HTM process.

11. The method as claimed in claim 1, wherein, the LTPS pre-structure further comprises:
    providing an LTPS array substrate where the NMOS area, the PMOS area and the TFT area is predefined;
    forming a polysilicon layer and an amorphous silicon layer above the LTPS pre-structure in sequence;
    performing a crystallizing process which transforms the amorphous silicon layer to a polysilicon layer by laser annealing.

12. The method as claimed in claim 11, wherein, the polysilicon layer comprises a SiNx layer and a SiOx layer; and the SiOx layer covers the SiNx layer.

13. The method as claimed in claim 1, wherein, the photoresist layer is removed by ashing process.

* * * * *